United States Patent
Bleeker et al.

(10) Patent No.: US 6,999,161 B2
(45) Date of Patent: Feb. 14, 2006

(54) LITHOGRAPHIC APPARATUS, DEVICE MANUFACTURING METHOD, AND DEVICE MANUFACTURED THEREBY

(75) Inventors: Arno Jan Bleeker, Westerhoven (NL); Jozef Petrus Henricus Benschop, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 86 days.

(21) Appl. No.: 10/721,791

(22) Filed: Nov. 26, 2003

(65) Prior Publication Data

US 2004/0141166 A1    Jul. 22, 2004

(30) Foreign Application Priority Data

Nov. 27, 2002   (EP)   .................................. 02258164

(51) Int. Cl.
| | |
|---|---|
| G03B 27/54 | (2006.01) |
| G03B 27/42 | (2006.01) |
| B41J 2/47 | (2006.01) |
| B41J 15/14 | (2006.01) |
| G02B 27/28 | (2006.01) |

(52) U.S. Cl. ........................ 355/67; 355/53; 347/239; 347/241; 359/494

(58) Field of Classification Search .................. 355/53, 355/67, 71; 347/225, 231, 238, 239, 243, 347/255, 261; 430/5, 30, 296, 311, 396; 359/494, 495, 497

See application file for complete search history.

(56) References Cited

U.S. PATENT DOCUMENTS

| | | | | |
|---|---|---|---|---|
| 4,577,932 A | * | 3/1986 | Gelbart | ........................ 359/305 |
| 5,296,891 A | | 3/1994 | Vogt et al. | .................... 355/67 |
| 6,204,875 B1 | * | 3/2001 | De Loor et al. | ............. 347/241 |
| 6,379,867 B1 | | 4/2002 | Mei et al. | .................... 430/296 |
| 6,633,366 B1 | | 10/2003 | de Jager et al. | |
| 2001/0010536 A1 | * | 8/2001 | Katzir et al. | ................. 347/255 |
| 2001/0048515 A1 | * | 12/2001 | Mei | ............................ 355/71 |

FOREIGN PATENT DOCUMENTS

EP   1115031 A2   7/2001

OTHER PUBLICATIONS

European Search Report dated Oct. 1, 2003.

* cited by examiner

Primary Examiner—Alan Mathews
(74) Attorney, Agent, or Firm—Pillsbury Winthrop Shaw Pittman, LLP

(57) ABSTRACT

Apparatus and methods for compensating for the movement of a substrate in a lithographic apparatus during a pulse of radiation include providing an optical structure configured to move a patterned projection beam incident on the substrate in synchronism with the substrate.

21 Claims, 4 Drawing Sheets

LITHOGRAPHIC APPARATUS, DEVICE MANUFACTURING METHOD, AND DEVICE MANUFACTURED THEREBY

RELATED APPLICATIONS

This application claims priority to European Patent Application EP 02258164.9, filed Nov. 27, 2002, which document is herein incorporated by reference.

FIELD OF THE INVENTION

The present invention relates to lithographic projection apparatus and methods.

BACKGROUND

The term "programmable patterning structure" as here employed should be broadly interpreted as referring to any configurable or programmable structure or field that may be used to endow an incoming radiation beam with a patterned cross-section, corresponding to a pattern that is to be created in a target portion of a substrate; the terms "light valve" and "spatial light modulator" (SLM) can also be used in this context. Generally, such a pattern will correspond to a particular functional layer in a device being created in the target portion, such as an integrated circuit or other device (see below). Examples of such patterning structure include:

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and No. 5,523,193 and PCT patent applications WO 98/38597 and WO 98/33096, which documents are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

It should be appreciated that where pre-biasing of features, optical proximity correction features, phase variation techniques, and/or multiple exposure techniques are used, the pattern "displayed" on the programmable patterning structure may differ substantially from the pattern eventually transferred to the substrate or layer thereof.

Lithographic projection apparatus can be used, for example, in the manufacture of integrated circuits (ICs), flat panel displays, and other devices involving fine structures. In such a case, the programmable patterning structure may generate a circuit pattern corresponding to an individual layer of, for example, the IC, and this pattern can be imaged onto a target portion (e.g. comprising one or more dies and/or portion(s) thereof) on a substrate (e.g. a glass plate or a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

The lithographic projection apparatus may be of a type commonly referred to as a step-and-scan apparatus. In such an apparatus, each target portion may be irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., each of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The term "projection system" should be broadly interpreted as encompassing various types of projection system, including refractive optics, reflective optics, catadioptric systems, and micro lens arrays, for example. It is to be understood that the term "projection system" as used in this application simply refers to any system for transferring the patterned beam from the programmable patterning structure to the substrate. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams (such as ion beams or electron beams).

In presently known lithographic projection apparatus using programmable patterning structure, the substrate table is scanned in the path of the patterned projection beam (e.g. below the programmable patterning structure). A pattern is set on the programmable patterning structure and is then exposed on the substrate during a pulse of the radiation system. In the interval before the next pulse of the radiation system, the substrate table moves the substrate to a position as required to expose the next target portion of the substrate (which may include all or part of the previous target portion), and the pattern on the programmable patterning structure is updated if necessary. This process may be repeated until a complete line (e.g. row of target portions) on the substrate has been scanned, whereupon a new line is started.

During the small but finite time that the pulse of the radiation system lasts, the substrate table may consequently have moved a small but finite distance. Previously, such movement has not been a problem for lithographic projection apparatus using programmable patterning structure, e.g. because the size of the substrate movement during the pulse has been small relative to the size of the feature being exposed on the substrate. Therefore the error produced was not significant. However, as the features being produced on substrates become smaller, such error becomes more significant.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display (LCD) panels, thin-film magnetic heads, thin-film-transistor (TFT) LCD panels, printed circuit boards (PCBs), DNA analysis devices, etc. The skilled artisan will appreciate that, in the context of such alternative applications, any use of the terms "wafer" or "die" in this text should be considered as being replaced by the more general terms "substrate" and "target portion", respectively.

SUMMARY

A device manufacturing method according to an embodiment of the invention includes using a radiation system to provide a pulsed beam of radiation, and using a patterning structure to pattern the pulsed beam according to a desired pattern. The patterned beam is projected onto a target portion of a layer of radiation-sensitive material that at least partially covers a substrate, and the substrate is moved relative to the projection system. A path of the projected beam relative to the projection system is altered during at least one pulse of the pulsed beam, such that a cross-section of the projected beam in a plane parallel to a surface of the target portion is substantially stationary relative to the substrate during the at least one pulse. Several apparatus that may be applied to perform such a method, and devices manufactured thereby, are also disclosed.

BRIEF DESCRIPTION OF THE DRAWINGS

Exemplary embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, methods and apparatus that may be used to reduce errors caused by movement of the substrate during a pulse of the radiation system.

Figure 1:
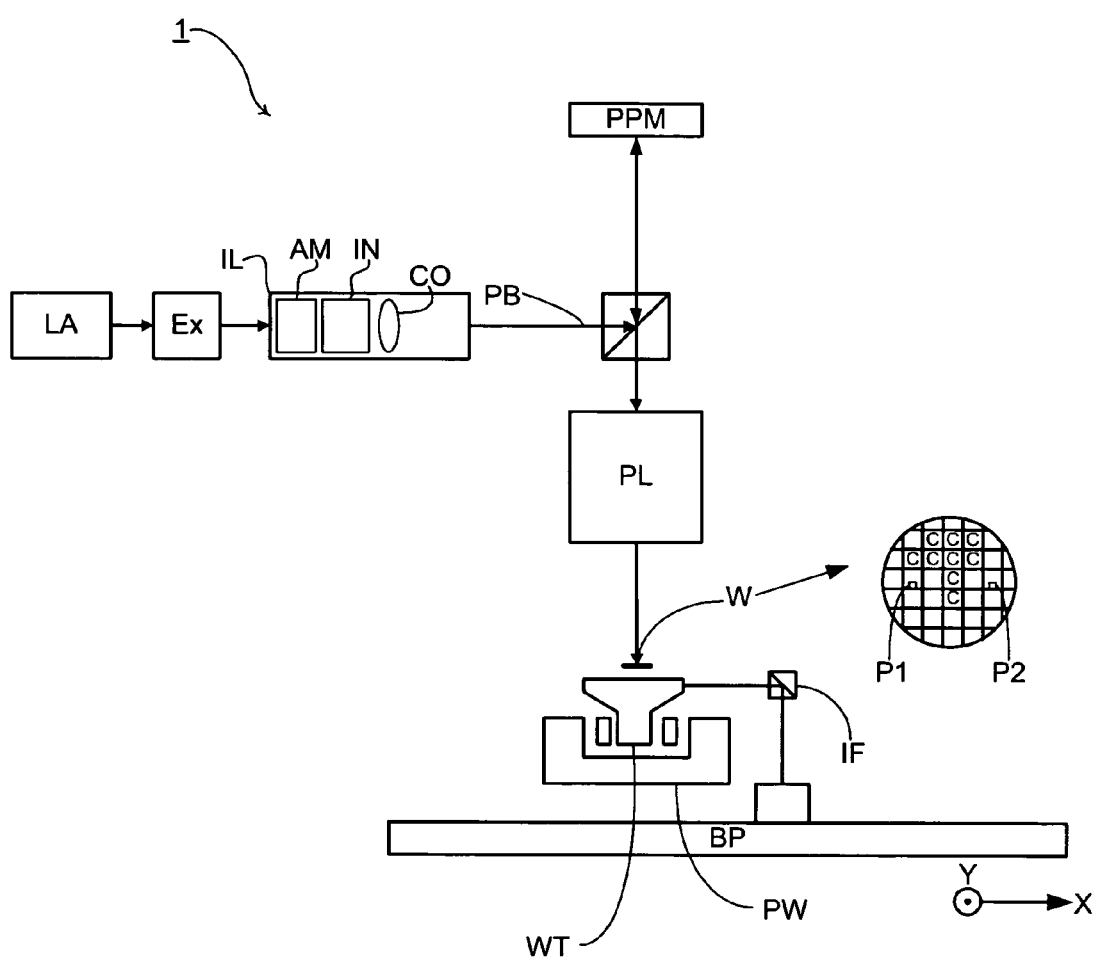
FIG. 1 depicts a lithographic projection apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation. In this particular example, the radiation system Ex, IL, for supplying a projection beam PB of radiation (e.g. UV or EUV radiation) also comprises a radiation source LA;

A programmable patterning structure PPM (e.g. a programmable mirror array) configured to apply a pattern to the projection beam. In general, the position of the programmable patterning structure will be fixed relative to item PL. However, it may instead be connected to a positioning structure configured to accurately position it with respect to item PL;

An object table (substrate table) configured to hold a substrate. In this example, substrate table WT is provided with a substrate holder for holding a substrate W (e.g. a resist-coated semiconductor wafer) and is connected to a positioning structure for accurately positioning the substrate with respect to item PL and (e.g. interferometric) measurement structure IF, which is configured to accurately indicate the position of the substrate and/or substrate table with respect to lens PL; and A projection system ("lens") PL (e.g. a quartz and/or $CaF_2$ lens system, a catadioptric system comprising lens elements made from such materials, and/or a mirror system) configured to project the patterned beam onto a target portion C (e.g. comprising one or more dies and/or portion(s) thereof) of the substrate W. The projection system may project an image of the programmable patterning structure onto the substrate; alternatively, the projection system may project images of secondary sources for which the elements of the programmable patterning structure act as shutters. The projection system may also comprise a micro lens array (MLA), e.g. to form the secondary sources and to project microspots onto the substrate.

As here depicted, the apparatus is of a reflective type (e.g. has a reflective programmable patterning structure). However, in general, it may also be of a transmissive type (e.g. with a transmissive programmable patterning structure) or have aspects of both types.

The source LA (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the programmable patterning structure PPM, which may be held on a mask table. Having been selectively reflected by (alternatively, having traversed) the programmable patterning structure PPM, the beam PB passes through the lens PL, which focuses the beam PB onto a target portion C of the substrate W. With the aid of the positioning structure (and interferometric measuring structure IF), the substrate table WT can be moved accurately, e.g. so as to position different target portions C in the path of the beam PB. Where used, a positioning structure for the programmable patterning structure PPM can be used to accurately position the programmable patterning structure PPM with respect to the path of the beam PB (e.g. after a placement of the programmable patterning structure PPM, between scans, and/or during a scan).

In general, movement of the object table WT may be realized with the aid of a long-stroke module (e.g. for coarse positioning) and a short-stroke module (e.g. for fine positioning), which are not explicitly depicted in FIG. 1. A similar system may be used to position the programmable patterning structure PPM. It will be appreciated that, to provide the required relative movement, the projection beam may alternatively or additionally be moveable, while the object table and/or the programmable patterning structure PPM may have a fixed position. Programmable patterning structure PPM and substrate W may be aligned using substrate alignment marks P, P2 (possibly in conjunction with alignment marks of the programmable patterning structure PPM).

The depicted apparatus can be used in several different modes. In one scan mode, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

An apparatus as depicted in FIG. 1 may be used, for example, in the following manner. In pulse mode, the programmable patterning structure is kept essentially stationary, and the entire pattern is projected onto a target portion C of the substrate using a pulsed radiation source. The substrate table WT is moved with an essentially constant speed such that the projection beam PB is caused to scan a line across the substrate W. The pattern on the programmable patterning structure is updated as required between pulses of the radiation system, and the pulses are timed such that successive target portions C are exposed at the required locations on the substrate. Consequently, the projection beam can scan across the substrate W to expose the complete pattern for a strip of the substrate. Such a process may be repeated until the complete substrate has been exposed line by line. Different modes may also be used.

An apparatus according to one embodiment of the invention includes a layer of electro-optical material through which the patterned projection beam passes. A control system may be provided to apply a control voltage across the electro-optical material, thereby changing the birefringence of the electro-optical material. The change in birefringence of the electro-optical material in response to changes in the control voltage moves the part of the patterned projection beam emitted from it that is polarized in a given direction. Therefore the patterned projection beam may be polarized such that all of the patterned projection beam is moved by changes in the birefringence of the electro-optical material.

Figure 2:
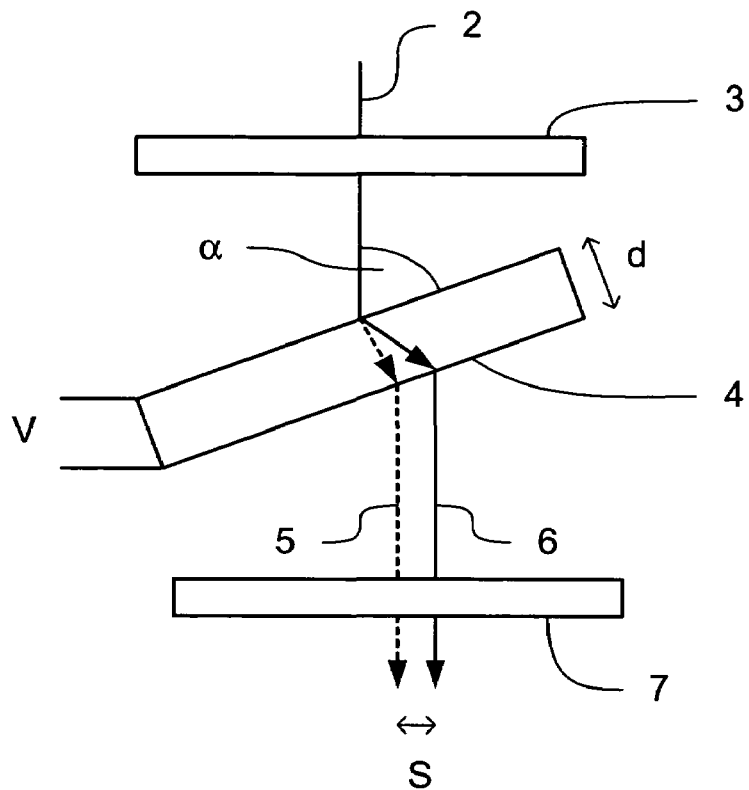
FIG. 2 depicts a structure configured to move the patterned projection beam according to an embodiment of the present invention.

FIG. 2 shows, schematically, an apparatus according to such an embodiment that may be applied to shift a patterned projection beam. As shown, the patterned projection beam 2 passes through a polarizing filter 3. The patterned projection beam then passes through a layer of electro-optical material 4. A voltage V applied to the electro-optical material 4 changes its birefringence as required. When no voltage is applied, the patterned projection beam follows the path denoted 5. When a voltage is applied to the electro-optical material 4 the patterned projection beam is shifted to the path denoted 6.

The optical axis of the electro-optical material 4 is oriented such that the polarized projection beam is shifted by the birefringence of the electro-optical material 4. The shift S produced by applying a voltage to the electro-optical material 4 can be determined by the following equation:

$$S = d \cdot \sin\alpha \cdot \cos\alpha \cdot \left( \frac{1}{\sqrt{n_1^2 - \sin^2\alpha}} - \frac{1}{\sqrt{n_0^2 - \sin^2\alpha}} \right) \quad [1]$$

where d is the thickness of the layer of electro-optical material, $\alpha$ is the angle between the patterned projection beam and the surface of the electro-optical material, $N_0$ is the ratio of the refractive index of the environment in which the apparatus functions to the refractive index of the electro-optical material when no voltage is applied and $n_1$ is the corresponding ratio of the refractive indices when a given voltage has been applied to the electro-optical material. Consequently, as the voltage applied to the electro-optical material is changed, the shift S changes. By applying a gradually changing voltage, the patterned projection beam can be caused to gradually shift. By applying an appropriately shaped signal to the electro-optical material, the patterned projection beam can be caused to scan in synchronism with the substrate as it moves during the short time of a pulse of the radiation system. Consequently, errors in the placement of features on the substrate may be reduced.

Although as here shown the patterned projection beam 2 is polarized by means of a polarizing filter 3, this need not be the case. In particular, the patterned projection beam 2 may already be polarized, for example, as a result of the programmable patterning means or because the radiation source inherently produces polarized radiation.

The electro-optical layer may be formed from one or more of any well-known electro-optical materials, such as ADP (ammonium dihydrogen phosphate), AD*P (deuterated ADP), KDP (potassium dihydrogen phosphate), and KD*P (deuterated KDP). In order to obtain the best response from the electro-optical material, it is preferably operated close to, but above, the Curie temperature of the material used. The Curie temperature is generally lower than the ambient temperature for the apparatus. The KDP for example has a Curie temperature of 123 K, KD*P has a Curie temperature variously reported as 213 or 222 K and ADP has a Curie temperature of 148 K. Consequently a temperature controlled cooling unit (not shown) may be provided to cool the electro-optical layer.

After traversing the electro-optical material, the patterned projection beam may then be passed through a quarter wavelength plate 7, for example, to circularly polarize the patterned projection beam if required. Alternatively, the patterned projection beam may remain linearly polarized or may be de-polarized.

Figure 3:
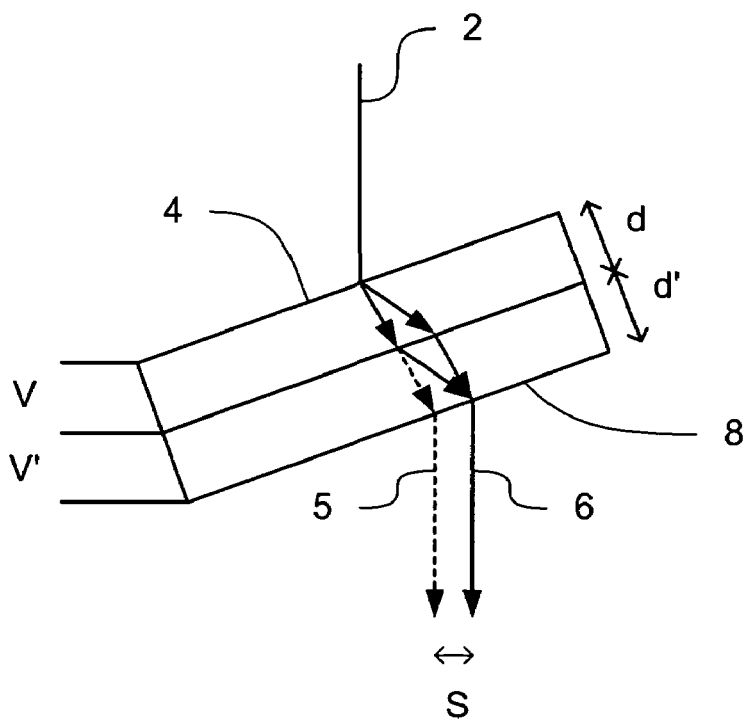
FIG. 3 depicts a structure configured to move the patterned projection beam according to a second embodiment of the present invention.

FIG. 3 shows an apparatus according to an alternative embodiment of the present invention. This embodiment is similar to the first embodiment, and the description of corresponding features will not be repeated. In this apparatus, a second layer of electro-optical material 8 is provided in the path of the patterned projection beam. The second layer 8, which may include one or more of the electro-optical materials described above, is oriented differently than the first layer 4. For example, the direction of the optical axis of the second layer 8 may be different from (e.g. perpendicular to) the direction of the optical axis of the first layer. Consequently, when a voltage V is applied to the first layer 4, radiation in the patterned projection beam that is polarized in a first direction is shifted and when a voltage V' is applied to the second layer 8 (e.g. changing its birefringence), radiation that is polarized in a second (e.g. orthogonal) direction is shifted. Therefore, by simultaneously applying appropriate voltages V, V' to both layers of electro-optical material 4, 8 the entire patterned projection beam 2 may be shifted, without the need for it to be polarized.

The shift produced by the second layer 8 of electro-optical material can be determined using Equation 1 given above. Some calibration may be required to ensure that both polarizations of the radiation are shifted by the same amount. For example, slight differences in the thicknesses D, D' of the two layers of electro-optical material 4, 8 can be compensated for by adjustments of voltage V and/or voltage V'. It has been found that a 7 kV voltage change across a layer of electro-optical material of 0.7 mm thickness produces a 50 nm shift.

An alternative embodiment of the invention includes a reflective surface configured to move the patterned projection beam relative to the projection system. For example, the reflective surface may be mounted such that the angle between the surface and the patterned projection beam incident on it can vary during the pulse of the radiation system. As the angle changes, so the position of the beam reflected from it is moved.

Figure 4:
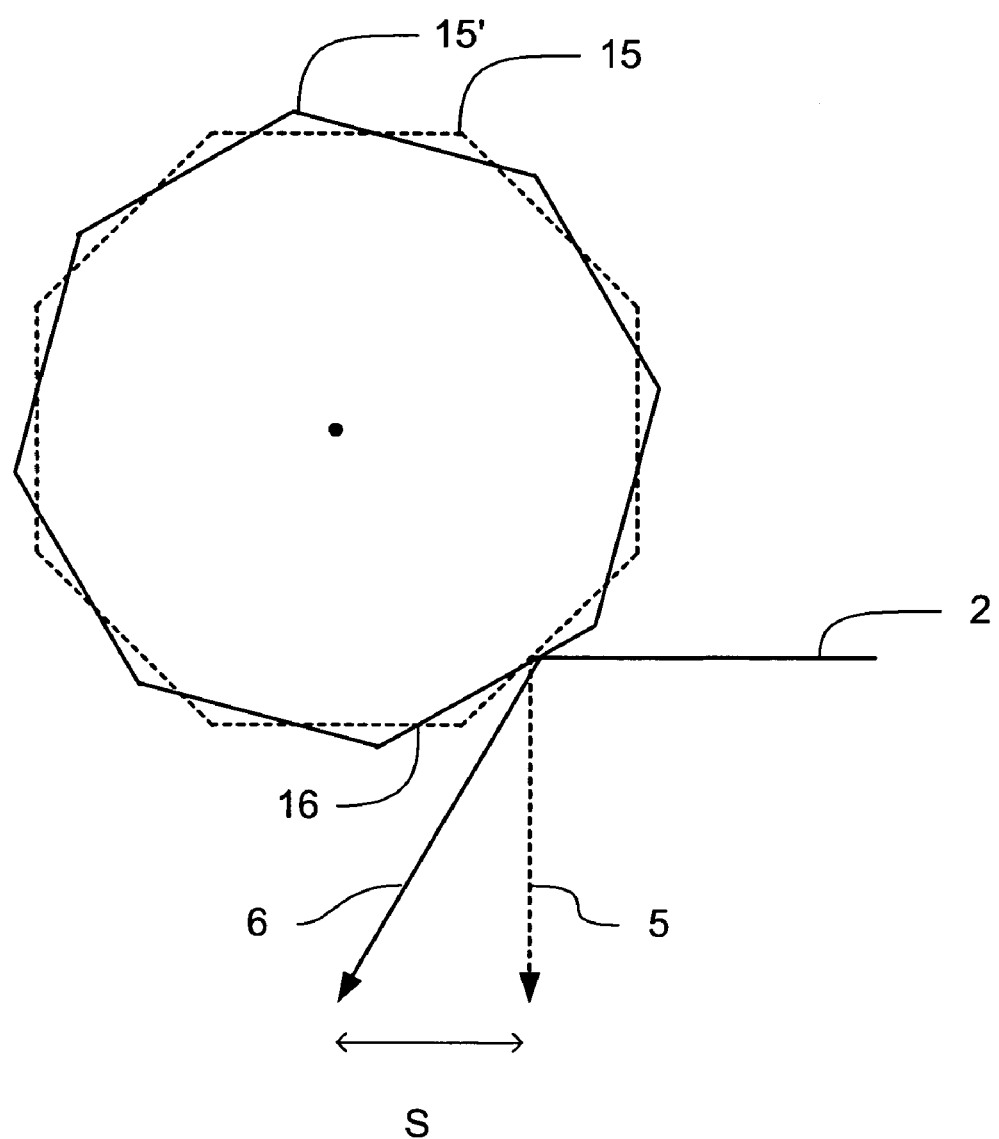
FIG. 4 depicts a structure configured to move the patterned projection beam according to a third embodiment of the present invention.

FIG. 4 shows an apparatus according to such an embodiment of the present invention. In this case, a rotating prism 15 having a polygonal cross-section is applied to shift the patterned projection means 2. Prism 15, here shown in cross section, may be located in the back focal plane of the lithographic apparatus. The prism has a plurality of faces 16 that are reflective to the patterned projection beam 2, such that the edge faces form a reflective surface. As the prism rotates, each face in turn reflects the patterned projection beam. Whilst the patterned projection beam is incident on each face, the angle of each face relative to the patterned projection beam changes.

FIG. 4 also shows an application of the apparatus at a first time point, when the prism 15 is in a first position, and at a second time point, when the prism 15' is in a second position. As the prism rotates, the angle at which the patterned projection beam 2 is incident on the reflective face 16 of the prism changes. Correspondingly, the angle at which the patterned projection beam 5, 6 radiates from the reflective face 16 also changes. As shown, the difference in angles between the reflected patterned projection beam 5 at the first time point and the reflected patterned projection beam 6 at the second time point produces a shift S where the patterned projection beam is incident on the substrate. By careful timing of the rotation of the prism 15 with respect to the pulse frequency of the radiation system and correct selection of the size of the prism, the patterned projection beam 2 can be made to scan in synchronism with the moving substrate for the duration of a pulse of radiation. In the interval between pulses of radiation, the prism 15 rotates to present a different face 16 at the start of the subsequent pulse of the radiation system. Potential advantages of systems including apparatus according to this embodiment may include that polarization of the patterned projection beam is not required and that the apparatus may be used in a lithographic projection apparatus that solely uses reflective components.

Figure 5:
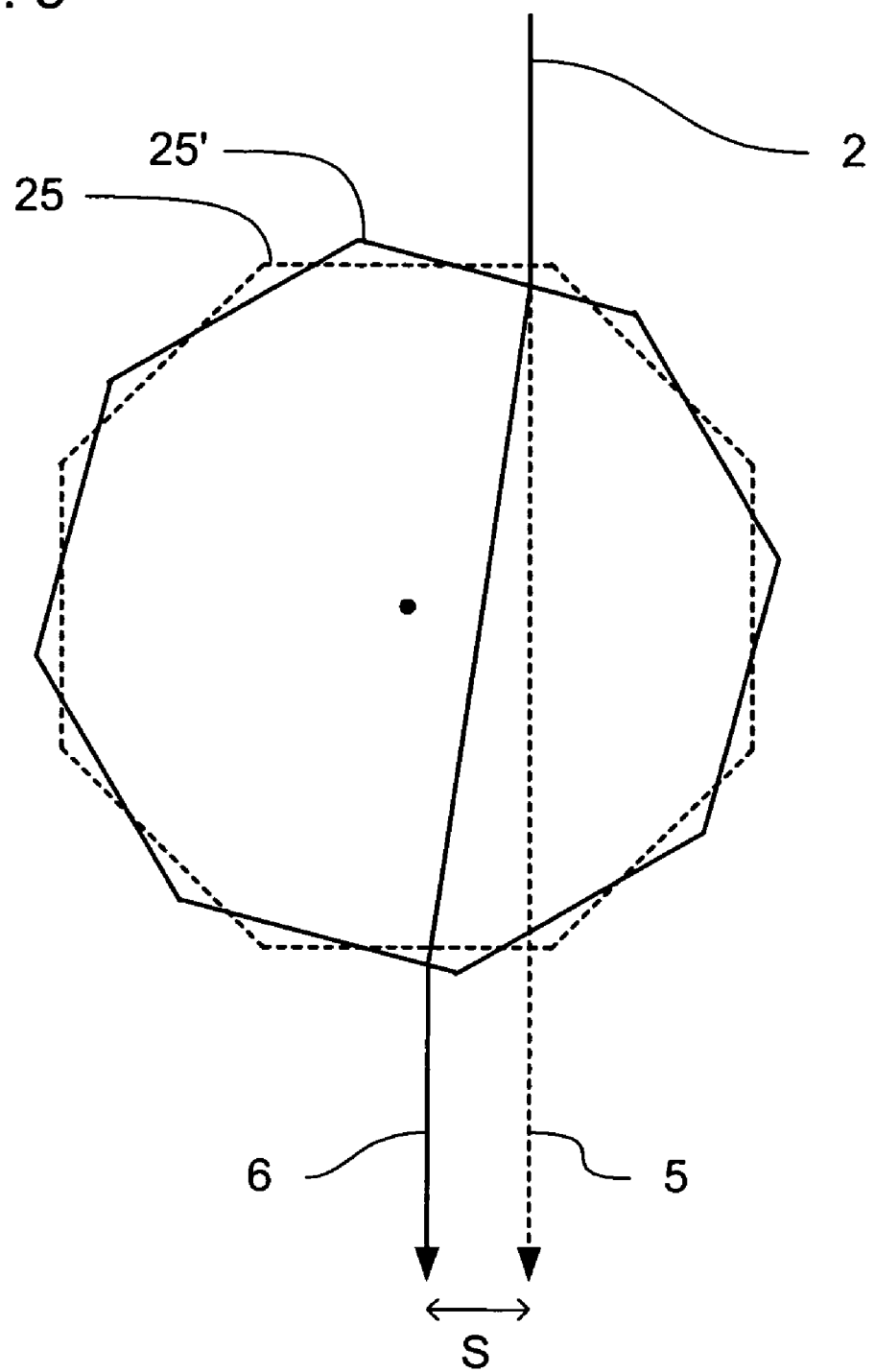
FIG. 5 depicts a variant of the structure shown in FIG. 4.

Alternatively, a transparent rotating prism 25 may be used, as shown in FIG. 5. In this case, the prism may be located in the imaging plane.

Errors caused by the movement of the substrate relative to the projection system during a pulse of radiation may be reduced by providing one or more apparatus to shift the patterned projection beam in synchronism with the movement of the substrate during a pulse of radiation, which may allow the projection beam to remain more accurately aligned on the substrate. Alternative structures that may be applied to shift the patterned projection beam are also within the scope of the invention.

It may be desirable to move the substrate at a constant velocity relative to the projection system during a series of pulses of the radiation system and the intervals in between the pulses. An apparatus as described herein may then be used to move the patterned projection beam in synchronism with the movement of the substrate for the duration of at least one pulse of the radiation system. Having the substrate moving at a constant velocity may reduce the complexity of the substrate table and the positional drivers associated with it, and moving the patterned projection beam in synchronism with the movement of the substrate may reduce consequent errors.

The patterned projection beam may be moved in synchronism with the movement of the substrate during a plurality of pulses. Such an arrangement may enable the images of the programmable patterning structure to be projected onto the same part of the substrate a plurality of times. This technique may be done, for example, if the intensity of the pulse of the patterned projection beam is not sufficient to produce a complete exposure on the substrate. Moving the patterned projection beam in synchronism with the substrate may reduce the occurrence of overlay errors between subsequent exposures of the pattern on the substrate.

Successive patterns on the programmable patterning structure that are exposed on the substrate by each pulse may be different. For example, corrections may be made in subsequent pulses to offset errors in a first pulse. Alternatively, changes in the pattern may be used to produce gray scale images for some of the features (for example, by only exposing those features for a proportion of the total number of pulses imaged onto a given part of the substrate).

Additionally (or alternatively) the intensity of the patterned projection beam, the illumination of the programmable patterning means, and/or the pupil filtering may be changed for one or more of the pulses of the radiation system that are projected onto the same part of the substrate. This technique may be used, for example, to increase the number of gray scales that may be generated using the technique described in the preceding paragraph or may be used to optimise different exposures for features oriented in different directions.

Whilst specific embodiments of the invention have been described above, it will be appreciated that the invention as claimed may be practiced otherwise than as described. For example, although use of a lithography apparatus to expose a resist on a substrate is herein described, it will be appreciated that the invention is not limited to this use, and an apparatus according to an embodiment of the invention may be used to project a patterned projection beam for use in resistless lithography. Thus, it is explicitly noted that the description of these embodiments is not intended to limit the invention as claimed.

The invention claimed is:

1. A lithographic projection apparatus comprising:
a radiation system configured to provide a pulsed beam of radiation;
a programmable patterning structure configured to pattern the pulsed beam according to a desired pattern;
a projection system configured to project the patterned beam onto a target portion of a substrate;
a positioning structure configured to move the substrate relative to the projection system during exposure by the patterned beam; and
an optical structure configured to move the projected beam relative to the projection system during at least one pulse of the pulsed beam such that the projected beam is shifted in synchronism with the movement of the substrate during said at least one pulse.

2. The lithographic projection apparatus according to claim 1, wherein the positioning structure is configured to move the substrate at a substantially constant velocity relative to the projection system during the course of a plurality of pulses of the radiation system and the intervals therebetween, and
wherein the projected beam is moved in synchronism with the movement of the substrate for the duration of at least one pulse of the pulsed beam.

3. The lithographic projection apparatus according to claim 1, wherein the projected beam is moved in synchronism with the movement of the substrate during a plurality of pulses of the pulsed beam such that a pattern of the programmable patterning structure is projected onto substantially the same place on the substrate a plurality of times.

4. The lithographic projection apparatus according to claim 3, wherein a configuration of the programmable patterning structure is changed between the plurality of projections onto substantially the same place on the substrate.

5. The lithographic projection apparatus according to claim 3, wherein at least one of an intensity of the projected beam, an illumination of the programmable patterning structure, and a pupil filtering are changed for at least one of the plurality of projections onto substantially the same place on the substrate.

6. The lithographic projection apparatus according to claim 1, wherein said optical structure comprises:
a layer of electro-optical material arranged in a path of the projected beam; and
a control system configured to apply a control voltage across at least a portion of the layer of electro-optical material,
wherein a birefringence of the electro-optical material of the layer varies according to a voltage across the material.

7. The lithographic projection apparatus according to claim 6, wherein the apparatus is configured such that the projected beam is polarized, and
wherein an optical axis of the layer of electro-optical material is oriented such that substantially all of the projected beam is moved.

8. The lithographic projection apparatus according to claim 6, wherein said optical structure further comprises a second layer of electro-optical material arranged in a path of the projected beam and across at least a portion of which the control system configured to apply a second control voltage,
wherein a birefringence of the electro-optical material of the second layer varies according to a voltage across the material, and
wherein a direction of an optical axis of the second layer of electro-optical material is substantially perpendicular to a direction of an optical axis of the first layer, such that changing the birefringence of both layers moves substantially all of the projected beam.

9. The lithographic projection apparatus according to claim 1, wherein said optical structure comprises a reflective surface mounted such that an angle between the surface and the projected beam incident upon it varies during a pulse of the pulsed beam.

10. The lithographic projection apparatus according to claim 9, wherein said optical structure comprises a rotating prism having a plurality of edge faces, and
wherein at least one edge face is the surface on which the patterned projection beam is incident during the pulse of the pulsed beam.

11. The lithographic projection apparatus according to claim 1, wherein said optical structure comprises an element that is transmissive to the beam of radiation, mounted such that an angle between the projected beam and a surface of the transmissive element on which it is incident varies during a pulse of the pulsed beam.

12. The lithographic projection apparatus according to claim 11, wherein said optical structure comprises a rotating prism having a plurality of edge faces, and
wherein at least one edge face is the surface on which the patterned projection beam is incident during the pulse of the pulsed beam.

13. A device manufacturing method, said method comprising:
using a radiation system to provide a pulsed beam of radiation;
using a patterning structure to pattern the pulsed beam according to a desired pattern;
projecting the patterned beam onto a target portion of a layer of radiation-sensitive material that at least partially covers a substrate;
moving the substrate relative to the projection system during exposure by the patterned beam; and
moving the projected beam relative to the projection system during at least one pulse of the pulsed beam such that the projected beam is shifted in synchronism with the movement of the substrate during said at least one pulse.

14. A lithographic projection apparatus comprising:
a radiation system configured to provide a pulsed beam of radiation;
a programmable patterning structure configured to pattern the pulsed beam according to a desired pattern;
a projection system configured to project the patterned beam onto a target portion of a substrate;
a positioning structure configured to move the substrate relative to the projection system during exposure by the patterned beam; and
an optical structure configured to alter a path of the projected beam relative to the projection system during at least one pulse of the pulsed beam such that a cross-section of the projected beam in a plane parallel to a surface of the target portion is shifted in synchronism with the movement of the substrate during said at least one pulse.

15. The lithographic projection apparatus according to claim 14, wherein said optical structure comprises:
a layer of electro-optical material arranged in a path of the projected beam; and
a control system configured to vary a birefringence of at least a portion of the layer of electro-optical material according to a control voltage.

16. The lithographic projection apparatus according to claim 14, wherein said optical structure further comprises a second layer of electro-optical material arranged in a path of the projected beam and across at least a portion of which the control system configured to apply a second control voltage,
wherein the control system is further configured to vary a birefringence of at least a portion of the second layer of electro-optical material according to a second control voltage, and
wherein a direction of an extraordinary axis of the second layer of electro-optical material is substantially perpendicular to a direction of an extraordinary axis of the first layer.

17. The lithographic projection apparatus according to claim 14, wherein said optical structure comprises a reflective surface mounted such that an angle between the surface and the projected beam incident upon it varies during a pulse of the pulsed beam.

18. The lithographic projection apparatus according to claim 17, wherein said optical structure comprises an element that is transmissive to the beam of radiation, mounted such that an angle between the projected beam and a surface of the transmissive element on which it is incident varies during a pulse of the pulsed beam.

19. A device manufacturing method, said method comprising:
using a radiation system to provide a pulsed beam of radiation;
using a patterning structure to pattern the pulsed beam according to a desired pattern;
projecting the patterned beam onto a target portion of a layer of radiation-sensitive material that at least partially covers a substrate;
moving the substrate relative to the projection system during exposure by the patterned beam; and
altering a path of the projected beam relative to the projection system during at least one pulse of the pulsed beam such that a cross-section of the projected beam in a plane parallel to a surface of the target portion is shifted in synchronism with the movement of the substrate during said at least one pulse.

20. The device manufacturing method according to claim 19, wherein altering a path of the projected beam includes altering the path in synchronism with said moving the substrate during a plurality of pulses of the pulsed beam, such that the desired pattern is projected onto substantially the same place on the target portion a plurality of times.

21. The device manufacturing method according to claim 20, wherein a configuration of the programmable patterning structure is changed between the plurality of projections onto substantially the same place on the substrate.

* * * * *